United States Patent
Baumgartl et al.

(10) Patent No.: US 6,653,833 B2
(45) Date of Patent: Nov. 25, 2003

(54) METHOD FOR SAMPLING A RECEIVED RADIO-FREQUENCY SIGNAL, IN PARTICULAR A RADIO-FREQUENCY SIGNAL FROM A RECEIVING COIL IN A MAGNETIC RESONANCE APPARATUS

(75) Inventors: Rudi Baumgartl, Erlangen (DE); Georg Pirkl, Dormitz (DE)

(73) Assignee: Siemens Aktiengesellschaft, Münich (DE)

( * ) Notice: Subject to any disclaimer, the term of this patent is extended or adjusted under 35 U.S.C. 154(b) by 41 days.

(21) Appl. No.: 09/968,131

(22) Filed: Oct. 1, 2001

(65) Prior Publication Data

US 2002/0079892 A1 Jun. 27, 2002

(30) Foreign Application Priority Data

Sep. 29, 2000 (DE) .......................... 100 48 344

(51) Int. Cl.$^7$ ................................. G01V 3/00
(52) U.S. Cl. ........................ 324/307; 324/309
(58) Field of Search .................. 324/322, 309, 324/307, 312, 318; 341/143; 128/653

(56) References Cited

U.S. PATENT DOCUMENTS

| | | | | |
|---|---|---|---|---|
| 4,682,106 A | * | 7/1987 | Vatis et al. | 324/307 |
| 4,879,514 A | * | 11/1989 | Mehlkopf et al. | 324/309 |
| 5,170,123 A | * | 12/1992 | Halland et al. | 324/322 |
| 5,442,292 A | * | 8/1995 | Kolem et al. | 324/322 |
| 6,297,637 B1 | * | 10/2001 | Feld et al. | 324/322 |
| 6,486,811 B2 | * | 11/2002 | Clara et al. | 341/143 |

FOREIGN PATENT DOCUMENTS

GB    2 362 279 A    *   5/2000

* cited by examiner

Primary Examiner—Diego Gutierrez
Assistant Examiner—Brij B. Shrivastav
(74) Attorney, Agent, or Firm—Schiff Hardin & Waite

(57) ABSTRACT

In a method for sampling a received radio-frequency signal, in particular a radio-frequency signal from a receiving coil in a magnetic resonance apparatus, the received radio-frequency signal is down-mixed to a low-frequency baseband such as for image production. The radio-frequency signal from a receiving coil in a magnetic resonance apparatus is passed directly to a high clock rate analog/digital converter where it is converted, as a function of the clock, to a lower frequency, after which it is down-mixed by digital demodulation to a baseband at an even lower frequency.

19 Claims, 1 Drawing Sheet

METHOD FOR SAMPLING A RECEIVED RADIO-FREQUENCY SIGNAL, IN PARTICULAR A RADIO-FREQUENCY SIGNAL FROM A RECEIVING COIL IN A MAGNETIC RESONANCE APPARATUS

BACKGROUND OF THE INVENTION

1. Field of the Invention

The present invention relates to a method for sampling a radio-frequency received signal which is down-mixed to a low-frequency baseband, in particular for the purposes of image production, such as the radio-frequency signal from a receiving coil in a magnetic resonance apparatus.

2. Description of the Prior Art

In known magnetic resonance systems, the radio-frequency signal which contains the measured patient information that is intended to be displayed as part of the magnetic resonance image, and which is picked up by a receiving coil, is down-mixed, by means of expensive and complex radio-frequency and analog circuits, to a baseband or to an intermediate frequency which is below the Nyquist limit of the sampler. This has been done in one stage, or generally in a number of stages. In addition, additional LO (local oscillator) carrier signals are required for each stage for this purpose, and these are derived from a mother oscillator, which is part of the complex circuit arrangement. In this case the LO frequencies have to be selected such that no mixing product is produced in the useful band. If any disturbing mixing products occurred despite this, they are removed by complex bandpass and low-pass filters, which result in further circuit complexity and costs.

After the radio-frequency signal which contains the useful information is down-mixed to baseband, the signal is digitized, such that the Nyquist criterion is satisfied, using a high-resolution and expensive analog/digital converter with an upstream low-pass filter, and is supplied directly to the further signal processing in order to produce the magnetic resonance image. The process of mixing down the radio-frequency received signal to an intermediate frequency followed by digitization means that digital demodulation is also required in order to change the signal to baseband. The Nyquist criterion once again had to be satisfied during digitization.

Overall, the sampling of radio-frequency received signals in the field of magnetic resonance apparatus is associated with a very high level of circuit complexity, which is extremely complicated and costly.

SUMMARY OF THE INVENTION

An object of the present invention is to provide a method for sampling, which allows reliable signal sampling with little circuit complexity.

In order to achieve this object using a method of the type initially described, the invention provides that the received radio-frequency signal is passed directly to a high clock rate analog/digital converter where it is converted, as a function of the clock, to a lower frequency, after which it is down-mixed by digital demodulation to a baseband at an even lower frequency.

In contrast to known methods, in the method according to the invention the received radio-frequency signal is not down-mixed to baseband before digitization but instead the received signal is passed directly to a high clock rate, broadband and high-speed analog/digital converter. The clock frequency of the analog/digital converter is such that, after conversion, the digital converter signal is in a frequency band which is lower than the original signal frequency. With regard to the sampling frequency, all that need be borne in mind is to ensure that the sampling is below the Nyquist criterion, while at the same time complying with the extended Nyquist criterion. The capability to apply the radio-frequency received signal directly to the analog/digital converter is a result of the fact that converters have now become available which operate with very broad bandwidths and have extremely low noise levels, with a very high clock frequency at the same time. This converter generation allows even high received signal frequencies to be processed, such as those in the signal received from a magnetic resonance apparatus where, depending on the system design, signals may be received even at frequencies above 60 MHZ.

According to the Nyquist criterion, a necessary condition for reproducibility of the received signal is that the sampling frequency is at least twice the signal frequency. The sampling process results in the frequency packet being repeated more than once, cyclically and as a function of the sampling frequency, in the frequency band extending from $-\infty$ to $+\infty$. If the sampling frequency is below the Nyquist criterion, the signals become superimposed thus resulting in "mixing products" which make it more complicated to reproduce the received signal after digitization. However, if the sampling frequency is at or above the Nyquist criterion, then reproducibility is feasible, since there are no superimposition effects.

According to the extended Nyquist criterion, a sufficient condition for reproducible sampling is for the sampling frequency to be at least twice the bandwidth of the useful signal, in this case of the signal which is received from the receiving coil and carries the useful information. If the signal bandwidth, which is limited by previous filtering, is, for example, ±250 kHz, then the sampling frequency must be at least 1 MHZ. Thus, if a limited bandwidth signal is present, it is generally sufficient for the sampling to comply only with the extended Nyquist criterion, i.e., sampling can be carried out using a frequency below twice the signal frequency, provided it corresponds at least to twice the bandwidth of the signal.

Since the received signal carrying the useful information required for image processing has a relatively narrow bandwidth, it is possible for magnetic resonance system to use sampling frequencies which are well below the Nyquist criterion.

The digital converter signal, whose frequency is already well below that of the received signal, is then digitally demodulated and is down-mixed to the low-frequency baseband. Any suitable known demodulation method may be used for demodulation.

Overall, the method according to the invention allows reliable sampling with considerably less circuit complexity since there is no longer any need for complex and expensive radio-frequency and analog circuits, which are provided in the prior art for down-mixing the radio-frequency received signal. As a consequence, it is possible to keep the sampling circuit arrangement very small, and to integrate it at a suitable point on already existing circuit boards. Conversely, it is possible to integrate the analog/digital converter directly into the coil so that, in this case, the converter signal, which is already at a lower frequency, is passed to the downstream demodulation stage, which is external to the coil.

In order to reduce the amount of noise in the received radio-frequency signal, it is expedient to filter the received signal in a bandpass filter before passing it to the analog/digital converter. This filter, which expediently filters the received signal to a bandwidth in the range between ±100 kHz to ±500 kHz, in particular of ±250 kHz, about the received signal frequency, makes it possible to filter out those frequencies which are above and below this band and do not contain any useful signal, but only noise, so that the converter need process only the filtered received signal, which contains considerably less noise.

Furthermore, it is advantageous for the received signal to be amplified before being passed to the analog/digital converter and, expediently, before the previous filtering. This amplification allows the signal to be matched to the performance parameters of the analog/digital converter so that it can be driven at an appropriate level.

A multiplication stage is expediently used for demodulation. Furthermore, data reduction can be carried out in a digital low-pass filter stage after demodulation, since, because of the high sampling frequency, which may be in the order of magnitude of several tens of megahertz, the amount of data is too great for the subsequent signal processing, and a large amount of data of this type is also not required for image production.

In addition to the method according to the invention, the invention also relates to a magnetic resonance apparatus having a circuit arrangement for sampling a radio-frequency received signal from a receiving coil, with the circuit arrangement having:

a high clock rate analog/digital converter, to which the radio-frequency received signal can be passed directly, for clock-dependent conversion of the radio-frequency received signal to a lower frequency, and a digital demodulation device, which is connected downstream from the analog/digital converter, for down-mixing the digital output signal from the analog/digital converter to a lower-frequency baseband.

According to the invention, a bandpass filter for limiting the received signal to a specific bandwidth may be connected upstream of the analog/digital converter, preferably using a bandwidth in the range from ±100 kHz to ±500 kHz, in particular of ±250 kHz. An amplifier device for amplifying the received signal may be connected upstream of the analog/digital converter, with this amplifier device being designed such that the incoming received signal is designed for optimum matching of the signal to the performance parameters of the analog/digital converter. Known analog/digital converters require a signal amplitude of approximately 1 V while, in contrast, the receiving coil produces signals in the order of magnitude of approximately 0.1 V.

Furthermore, it is possible to provide for the demodulation device to have a multiplication stage, with at least one low-pass filter stage expediently being connected downstream from the demodulation device for data reduction. Finally, the analog/digital converter may be integrated directly in the receiving coil.

DESCRIPTION OF THE PREFERRED EMBODIMENTS

Figure 1:
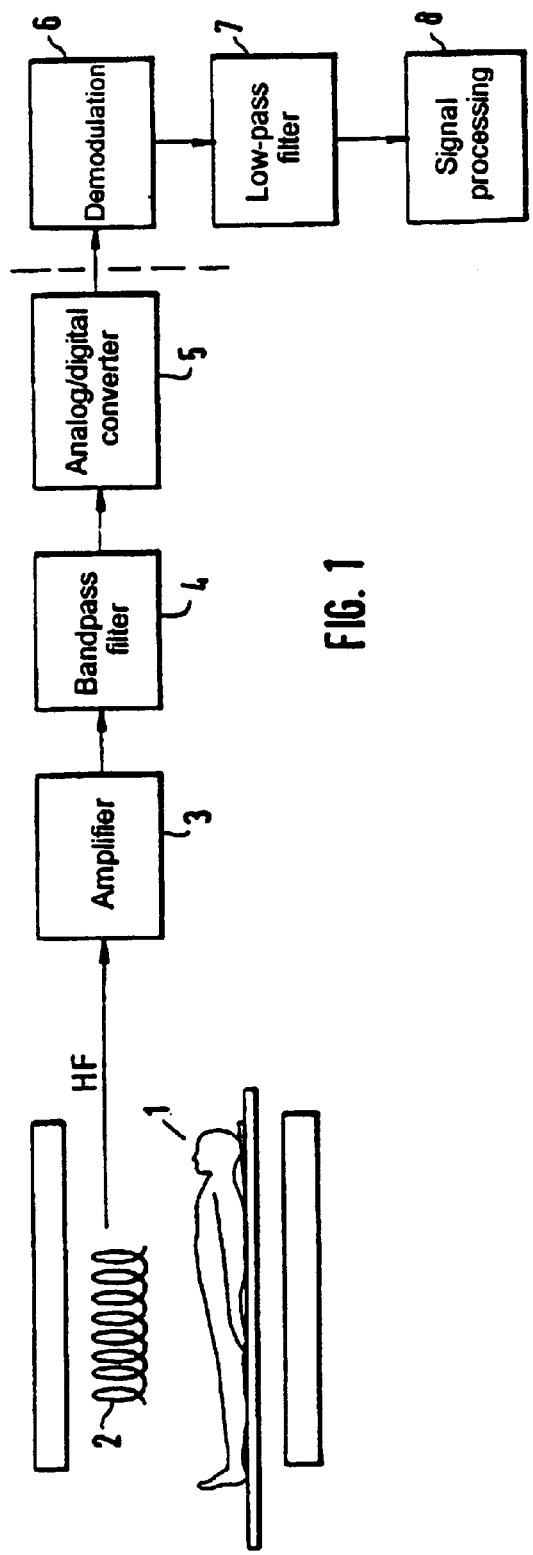
FIG. 1 is a block diagram of a magnetic resonance apparatus constructed and operating according to the invention, with a sampling circuit arrangement.

FIG. 1 shows a magnetic resonance apparatus according to the invention. The illustration shows a patient 1. After appropriate stimulation, a radio-frequency received signal HF is received by means of a receiving coil 2. The method of operation of a magnetic resonance apparatus is known per se and there is no need to describe this in any further detail since all that is significant to the invention is the area in which the received radio-frequency signal is sampled.

Figure 2:
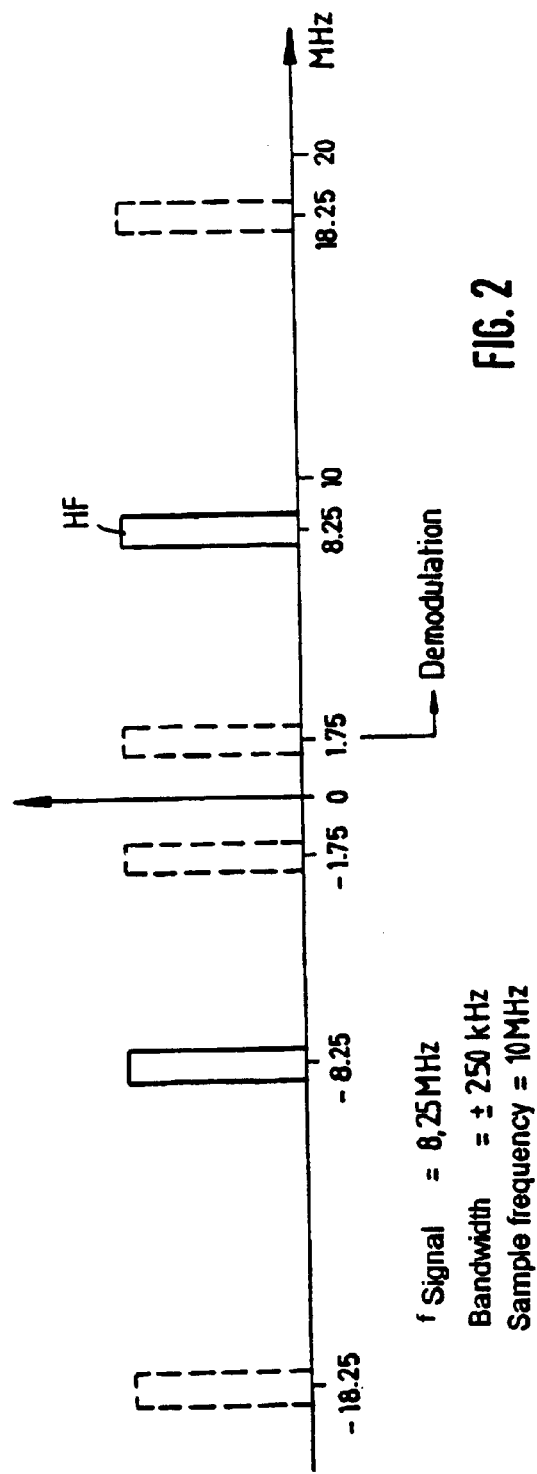
FIG. 2 shows the signal frequency spectrum before and after conversion in accordance with the invention.

This received radio-frequency signal HF is then amplified in an amplifier device 3 in such a manner that the signal is optimally matched to the performance parameters of a downstream analog/digital converter 5. The amplified signal is then filtered by means of a bandpass filter 4, in order to filter out higher- and lower-frequency noise components, with the filtered useful band having a bandwidth of +250 kHz, for example. Despite the filtering and amplification, the received signal is still at radio frequency, as before. The frequency of the received signal is now reduced, and is digitized at the same time, in the analog/digital converter 5. The analog/digital converter sampling frequency is chosen such that it is below the Nyquist criterion, but complies with the extended Nyquist criterion. Accordingly, the sampling frequency is at least 1 MHZ where, for example, the bandpass filtering results in a useful bandwidth of ±250 kHz. The sampling frequency that results from the Nyquist criterion is several megahertz, depending on the design of the magnetic resonance apparatus. Thus, for example, a 0.2 T magnetic resonance apparatus produces a received signal at 8.25 MHZ. According to the Nyquist criterion, the sampling frequency would need to be at least 16.5 MHZ in order to achieve reproducible sampling. Since, in this case, the useful band has a width of only 500 kHz, it is possible to choose any desired sampling frequency between 1 MHZ and the Nyquist sampling frequency. In this case, for example, sampling may be carried out using a converter clock rate of 10 MHZ. FIG. 2 will be described in more detail in order to explain the converter function. The converter as well as the amplifier and filter devices may be arranged on the coil, as is indicated by the dashed line.

After digitization, the digital converter signal, which is largely resistant to noise due to the digitization and in consequence is no longer influenced by further apparatus elements, is demodulated in a demodulation device 6 and is down-mixed to a desired baseband. Low-pass filtering is then carried out for data reduction in a low-pass filter stage 7, after which the signals are passed on to a signal processing device 8, which processes the signals for image production.

FIG. 2 shows the method of operation of the analog/digital converter for a sampling frequency which is below the Nyquist criterion but complies with the extended Nyquist criterion. On the abscissa, the graph shows the frequency spectrum from $-\infty$ to $-\infty$, while the ordinate shows the signal amplitude. In the illustrated example, the received signal HF is at a frequency of 8.25 MHZ and has a bandwidth of ±250 kHz. The analog/digital converter sampling frequency is 10 MHZ. The received signal is thus present in both positive and negative form, that is to say the received signal is also produced at a frequency of −8.25 MHZ.

Owing to the sampling frequency of 10 MHZ, the received signal is repeated periodically at a frequency of $f=f_{HF} \pm n*\text{fsampling}$. In the illustrated exemplary embodiment, this means that the received signal at 8.25 MHZ also occurs at a frequency of 18.25 MHZ, 28.25 MHZ, etc., and at −1.75 MHZ, −11.75 MHZ, etc. A corresponding argument applies to the received signal at −8.25 MHZ, which is present at +1.75 MHZ, etc. and at −18.25 MHZ, etc. The low-frequency signal at 1.75 MHZ is used for demodulation, and is then down-mixed to baseband.

As a second example, an 1T magnetic resonance apparatus is considered, with a received signal at 40.45 MHZ, which is once again limited by a bandpass filter to a useful band of ±250 kHz. By way of example, a sampling frequency of 30 MHZ is chosen here. This sampling frequency is below both the Nyquist criterion and the signal frequency itself, but nevertheless still satisfies the extended Nyquist criterion. In a corresponding way to the clock-dependent periodic signal repetition already explained in conjunction with FIG. 2, there is a signal here at 10.45 MHZ (received signal frequency−sampling frequency=40.45 MHZ−30 MHZ). This signal frequency may be used as an intermediate frequency, which is down-mixed to baseband via digital demodulation.

As can be seen, other suitable sampling frequencies may also be used, in order to obtain a digital converter signal at different frequencies after digitization.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for sampling a received radio-frequency signal comprising the steps of:

receiving a radio-frequency signal, as a received radio-frequency signal, at a first frequency with a receiving coil;

supplying said received radio-frequency signal directly from said receiving coil to a high clock rate analog-to-digital converter;

converting said received radio-frequency signal in said analog-to-digital converter, as a function of the clock rate, to a digital signal having a second frequency which is lower than said first frequency; and digitally demodulating said digital signal from said analog-to-digital converter by down-mixing to a baseband signal at a third frequency which is lower than said second frequency.

2. A method as claimed in claim 1 comprising receiving said radio-frequency signal with a receiving coil in a magnetic resonance apparatus, and employing said baseband signal for generating an image of an examination subject from which said radio-frequency signal was emitted.

3. A method as claimed in claim 1 comprising filtering said received radio-frequency signal with a bandpass filter before supplying said received radio-frequency signal to said analog-to-digital converter.

4. A method as claimed in claim 1 comprising amplifying said received radio-frequency signal before supplying said received radio-frequency signal to said analog-to-digital converter.

5. A method as claimed in claim 1 comprising employing a multiplication stage for digitally demodulating said digital signal.

6. A method as claimed in claim 1 comprising supplying said baseband signal to a digital lowpass filter stage for data reduction thereof.

7. A magnetic resonance apparatus comprising:

a receiving coil which receives a radio-frequency signal, as a received radio-frequency signal, said received radio-frequency signal having a first frequency;

a sampling circuit connected to said receiving coil for sampling said radio-frequency received signal; and said sampling circuit comprising a high clock rate analog-to-digital converter which is directly supplied with said received radio-frequency signal from said receiving coil, said analog-to-digital converter converting said received radio-frequency signal, dependent on said clock rate, to a digital signal having a second frequency lower than said first frequency, and a digital demodulation device connected downstream from said analog-to-digital converter for down-mixing said digital signal to generate a base band signal having a third frequency which is lower than said second frequency.

8. A magnetic resonance apparatus as claimed in claim 7 further comprising a bandpass filter connected upstream of said analog-to-digital converter.

9. A magnetic resonance apparatus as claimed in claim 8 wherein said bandpass filter is integrated with said receiving coil.

10. A magnetic resonance apparatus as claimed in claim 9 wherein said analog-to-digital converter and said bandpass filter are integrated with said receiving coil.

11. A magnetic resonance apparatus as claimed in claim 7 further comprising an amplifier for amplifying said received radio-frequency signal connected upstream of said analog-to-digital converter.

12. A magnetic resonance apparatus as claimed in claim 11 wherein said amplifier is integrated with said receiving coil.

13. A magnetic resonance apparatus as claimed in claim 12 wherein said amplifier and said analog-to-digital converter are integrated with said receiving coil.

14. A magnetic resonance apparatus as claimed in claim 7 further comprising a bandpass filter and an amplifier connected upstream of said analog-to-digital converter.

15. A magnetic resonance apparatus as claimed in claim 14 wherein said bandpass filter and said amplifier are integrated with said receiving coil.

16. A magnetic resonance apparatus as claimed in claim 15 wherein said bandpass filter and said amplifier and said analog-to-digital converter are integrated with said receiving coil.

17. A magnetic resonance apparatus as claimed in claim 7 wherein said analog-to-digital converter is integrated with said receiving coil.

18. A magnetic resonance apparatus as claimed in claim 7 wherein said demodulation device includes a multiplication stage.

19. A magnetic resonance apparatus as claimed in claim 7 further comprising a lowpass filter connected downstream from said demodulation device for performing data reduction of said baseband signal.

* * * * *